United States Patent
Rodriguez et al.

[11] Patent Number: 5,821,160
[45] Date of Patent: Oct. 13, 1998

[54] METHOD FOR FORMING A LASER ALTERABLE FUSE AREA OF A MEMORY CELL USING AN ETCH STOP LAYER

[75] Inventors: Robert A. Rodriguez; Douglas J. Dopp; Robert E. Booth, Jr., all of Austin, Tex.

[73] Assignee: Motorola, Inc., Schaumburg, Ill.

[21] Appl. No.: 659,376

[22] Filed: Jun. 6, 1996

[51] Int. Cl.$^6$ .................................................. H01L 21/268
[52] U.S. Cl. ..................... 438/601; 438/600; 438/129; 438/130; 438/131; 438/132
[58] Field of Search ................... 438/128, 129, 438/130, 131, 132, 308, 378, 600, 601, 385

[56] References Cited

U.S. PATENT DOCUMENTS

| | | | |
|---|---|---|---|
| 4,628,590 | 12/1986 | Udo et al. | 29/575 |
| 5,096,850 | 3/1992 | Lippitt, III | 438/385 |
| 5,235,205 | 8/1993 | Lippitt, III | 257/58 |

OTHER PUBLICATIONS

Sorab K. Ghandhi, VLSI Fabrication Principles, John Wiley and Sons (no month given), 1994.

*Primary Examiner*—Charles Bowers
*Assistant Examiner*—Keith Christianson
*Attorney, Agent, or Firm*—Keith E. Witek; George R. Meyer

[57] ABSTRACT

A method for manufacturing an static random access memory (SRAM) cell (10) begins by manufacturing a fuse region (36) over a substrate (10). An etch stop layer (44) is formed overlying the fuse region (36) from resistor polysilicon material. In order for the fuse region (36) to be accessed and properly disabled, an opening (60) must be provided which stops on the etch stop layer (44). The etch stop (44) ensures a consistent and repeatable optimal thickness X of dielectric material above the fuse region (36) to provide for proper laser access and repair. The etch stop layer (44) therefore reduces wafer to wafer and die to die variation in thickness X and provides for a higher yield laser repair for each SRAM integrated circuit and every wafer processed using this methodology.

21 Claims, 6 Drawing Sheets

METHOD FOR FORMING A LASER ALTERABLE FUSE AREA OF A MEMORY CELL USING AN ETCH STOP LAYER

FIELD OF THE INVENTION

The present invention relates generally to semiconductor circuit manufacturing, and more particularly, to using an etch stop layer to provide etch stopping capability which results in high yield access to a memory circuit fuse.

BACKGROUND OF THE INVENTION

In today's integrated circuit industry, SRAMs are formed that contain 4 Megabit to 16 Megabit random access memory cells per die. When attempting to obtain this kind of circuit density, it is nearly impossible to form every one of the millions of SRAM cells on each die with perfect 100% yield. Therefore, fuse technology is used along with laser repair techniques to allow for inoperable or defective SRAM cells to be removed from the SRAM array while redundant operable replacement cells can be coupled to the array to replace the newly-removed inoperative SRAM cell. These memory cell fuses are typically formed in lower levels of the integrated circuit such as the first few levels of conductive polysilicon. In order to provide access to these fuses, extremely deep oxide-etched openings must be etched through multiple dielectric layers to allow for selective laser access to the fuse.

Typically, the deep fuse openings are etched through the dielectric layers during the passivation etch simultaneously with bond pad openings which expose bond pads formed in a top metal level. In general, a few thousand Angstroms of dielectric material are etched to expose bond pad regions whereas over 30,000 Angstroms of additional dielectric material must be etched away from fuse regions to properly provide laser access to the underlying fuse regions. This 30,000 Angstrom depth of material must be removed while still leaving 3,000–5,000 Angstroms of oxide over the fuse for high-yield laser access. Typically, the deep laser repair opening has been formed by a timed etch which etches for a certain period of time with the hope that the 3,000–5,000 Angstrom final target dielectric cap thickness will be achieved without under-etching or over-etching out of the tolerance of this 3,000–5,000 Angstrom range. In order to ensure the achievement of this optimal 3,000–5,000 Angstrom cap range in manufacturing, statistical process control (SPC) for this etch step is significant, time consuming, expensive, and this etch process generally creates yield reduction.

Experiments have shown that variations in fuse cap oxide thickness under the laser repair opening and over the fuse element can be greater than 5,000 Angstroms wafer-to-wafer and/or die-to-die within a wafer. In general, a 5,000 Angstrom differential between die within a wafer is not uncommon. This 5,000 Angstrom differential is partially due to the timed etch which has no etch selectivity method of termination results in an extreme loss of yield in some circumstances and a larger likelihood that laser repair will be rendered impossible. Also, the large variation in oxide thickness is due to the collective nonuniformities of many etch, deposition, and planarization steps following the formation of the fuse. In addition, if not properly etched to a target remaining oxide thickness above the fuse in an initial pass, additional etch steps and/or multiple laser repair attempts may be required to remedy the shallow/under-etched opening, which consumes time and increases monetary expense. If over-etching occurs during the timed etch, then the lot is most likely scrapped resulting in yield loss.

Therefore, an improved method for etching through passivation and inter-level dielectric (ILD) layers is needed to provide low cost, higher-yield laser access to underlying fuses in memory cells.

BRIEF DESCRIPTION OF THE DRAWINGS

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention involves an improved method for forming a static random access memory (SRAM) cell which has a laser repairable area. The laser-repairable area contains a fuse exposed by an etched opening which can be selectively altered via a laser (or any energy source). The laser is used to open-circuit (i.e., blow) the fuse to allow for the disconnection of inactive or inoperable memory circuitry from the memory array of an integrated circuit. The repairable area taught herein is formed in an improved manner through the use of an etch stop layer.

In a static random access memory (SRAM) several levels of polysilicon are used to form each memory cell. Typically, a second level of polysilicon, referred to as window poly, is used to contact various source and drain electrodes of transistors in the substrate. This window poly or second poly layer is also lithographically patterned and etched to form fuses which are serially coupled in the bit line of each of the SRAM cells. An etch stop layer is formed from a third level of polysilicon, where the third level of polysilicon is also used to form resistive elements such as resistors or thin film transistors (TFT) for use in the SRAM cell via lithography and etch processes. The etch stop layer formed from the third level of polysilicon is formed directly overlying the fuse. After depositing subsequent dielectric layers, metal layers, and passivation over the polysilicon layers, the passivation and dielectric layers are etched to form a deep opening which exposes a portion of the etch stop layer. The etch stop layer is any material which is selective to the etch processing or etch chemistry used to remove the passivation and dielectric layers. By using the resistor poly to form this etch stop portion which overlies the fuse, consistent thicknesses of dielectric overlying the fuse can be consistently obtained from wafer to wafer and from die to die on many wafers over time. Therefore, laser repair of SRAM circuits can be performed with less, expense, higher yield and with greater throughput than was previously possible.

The invention involves placing one or more polysilicon etch stop regions over one or more polysilicon fuses in each memory cell so that laser access to the fuse region can be performed in a manner which improves memory integrated circuit (IC) yield. One advantage is that the use of the etch stop layer as taught herein will result in a reduction of passivation etch cycle time through a fabrication facility. By using an etch stop layer as taught herein, conventional statistic process control (SPC) involving the periodic measuring of the remaining oxide thickness over the fuse after deep oxide passivation etch is no longer required, and facility throughput is therefore improved. No film thickness measurements are required of the fuse opening in order to ensure that subsequent laser repair will be possible. By using an etch stop, over-etching and under-etching of the laser repair opening is no longer a problem, and passivation re-etches and customized passivation etch times which vary with each process change are eliminated. Oxide etch rate and uniformity requirements for passivation etching can be relaxed. Less equipment qualification time is required, and fewer statistic processing control wafers are required per wafer batch when using the etch stop taught herein.

Since the deep laser repair opening is usually etched in parallel with opening shallow bond pad contact regions, the invention taught herein will allow for improved process integration with less material damage. The quality of the openings formed through passivation is improved, and wafer-to-wafer fuse cap thicknesses are consistent and repeatable. If the laser repair opening is not properly formed to provide fuse cap thickness with a tight tolerance, laser repair cannot be completed and yield is reduced. Therefore, an SRAM device increase in yield has been observed when using the etch stop regions as taught herein. The use of an etch stop also reduces laser repair cycle time and minimizes laser repair set up time. In addition, using the etch stop layer taught herein ensures that laser repair can be performed in a single operation and eliminates the need for re-performing laser repair operations which failed due to deviations in fuse cap dielectric thickness (see dimension X in FIG. 7). In addition, by ensuring a consistent thickness of oxide X above the fuse, consistent and lower power laser energies can be used which can increase the operational life of the laser equipment.

The invention can be further understood with reference to FIGS. 1–8 herein. FIGS. 1–7 illustrate, in cross-sectional diagrams, various cross-sections of a portion of a static random access memory cell while the memory cell is being formed. The SRAM cell portion 10 is used to illustrate the invention. However, any integrated circuit such as a central processing unit (CPU), an (ASIC), or other memory cells such as EPROMs, EEPROMs, DRAMs, ferroelectric cells, and the like, can benefit from the fuse, etch stop, and laser technology taught herein. Therefore, the invention is not limited only to an SRAM cell 10 as illustrated in FIGS. 1–7.

Figure 1:
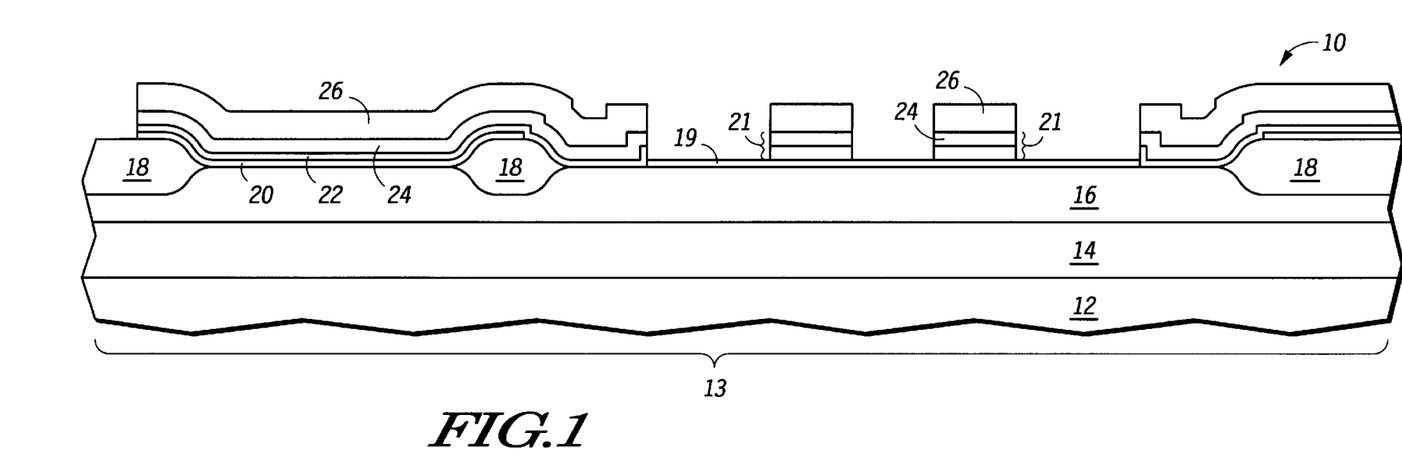
FIGS. 1–7 illustrate, in cross-sectional diagrams, a method for manufacturing a laser repairable SRAM circuit in accordance with the present invention.

SRAM cell 10 in FIG. 1 includes a substrate 12. In preferred form, the substrate 12 is a silicon material. However, other substrate materials and substrate types may be used herein, such as a germanium silicon substrate, a gallium arsenide substrate, a silicon-on-insulator (SOI) substrate, an epitaxially formed substrate, or like semiconductor substrates which are used in the industry. FIGS. 1–7 illustrate a cross-section of the SRAM cell only through an NMOS transistor array 13 as illustrated in FIG. 1.

Within the substrate 12, an array buried layer 14 is formed by using conventional boron ion implantation techniques, followed by epitaxial growth processing. Overlying the array buried layer 14, an implanted P-well 16 is formed. P-well 16 is typically formed by ion implanting boron or like P-type dopant atoms. Field oxide regions 18 are formed as illustrated in FIG. 1. It should be noted, however, that any isolation scheme such as trench isolation, polysilicon buffer local oxidation of silicon (LOCOS), etc., can be used in the embodiments taught herein.

A gate oxide 19 is formed over the substrate as illustrated in FIG. 1. The functional gate oxide may be formed after first forming a sacrificial gate oxide which is subsequently stripped via an etching process. The gate oxide may be a grown thermal oxide within an optimal operating thickness range of roughly 40 Angstroms to 200 Angstroms or may be a composite dielectric layer containing more than one type of oxide and/or dielectric.

A polysilicon layer 20 (referred to as A poly) is then deposited over the field oxide 18 and gate oxide 19. Openings are etched through the gate oxide layer 19 and the A poly layer 20 to provide for subsequent buried contact formation. A B polysilicon layer 22 (referred to as B poly) is deposited on top of the A polysilicon layer 20 to complete formation of a first polysilicon layer (comprising both A poly and B poly) and to form buried contacts transistor electrodes in the substrate as illustrated in FIG. 1. The first polysilicon layer 20 and 22 is lithographically patterned and etched to form gate electrodes 21 as illustrated in FIG. 1. As FIG. 1 illustrates, before lithographic processing, the gate electrodes may be stacked with dielectric capping layers or with silicide or refractory metal layers to form silicided top portions of the gate electrodes. Therefore, FIG. 1 illustrates that before the gate electrodes 21 are patterned from the layers 20 and 22, an optional refractory metal tungsten silicide or titanium silicide layer 24 is formed on top of the gate electrodes regions along with an optional nitride and/or oxide capping anti-reflective-coating (ARC) layer referred to as a capping layer 26.

Figure 2:
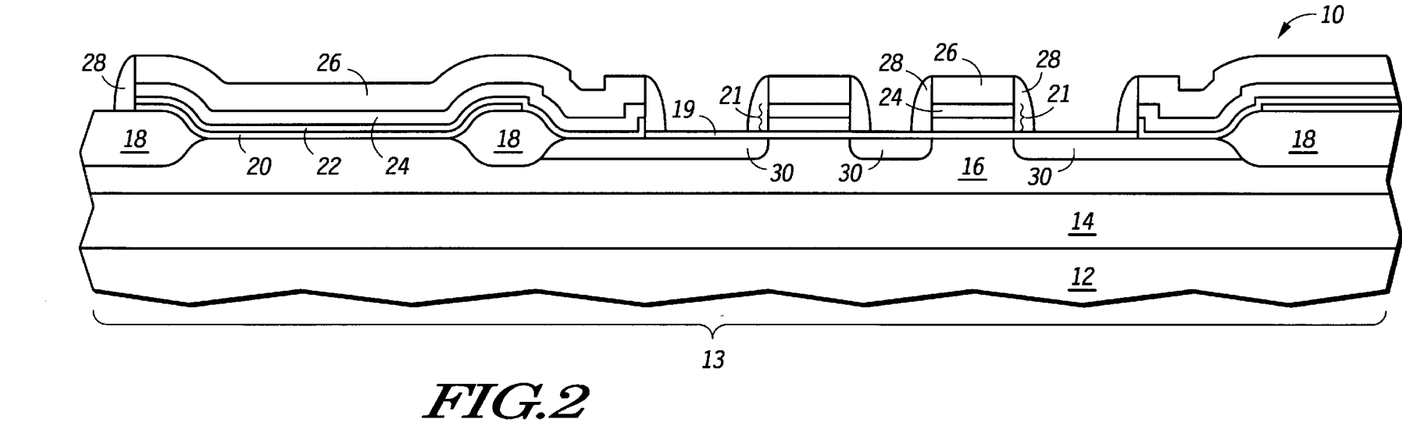

FIG. 2 illustrates that nitride spacers 28 are formed laterally adjacent to gate electrodes as illustrated in FIG. 2. In FIG. 2, self-aligned source and drain electrodes 30 are ion implanted into the substrate as illustrated. In one form, these electrodes can be lightly doped drain (LDD) regions formed using both spacer technology and ion implantation technology.

Figure 3:
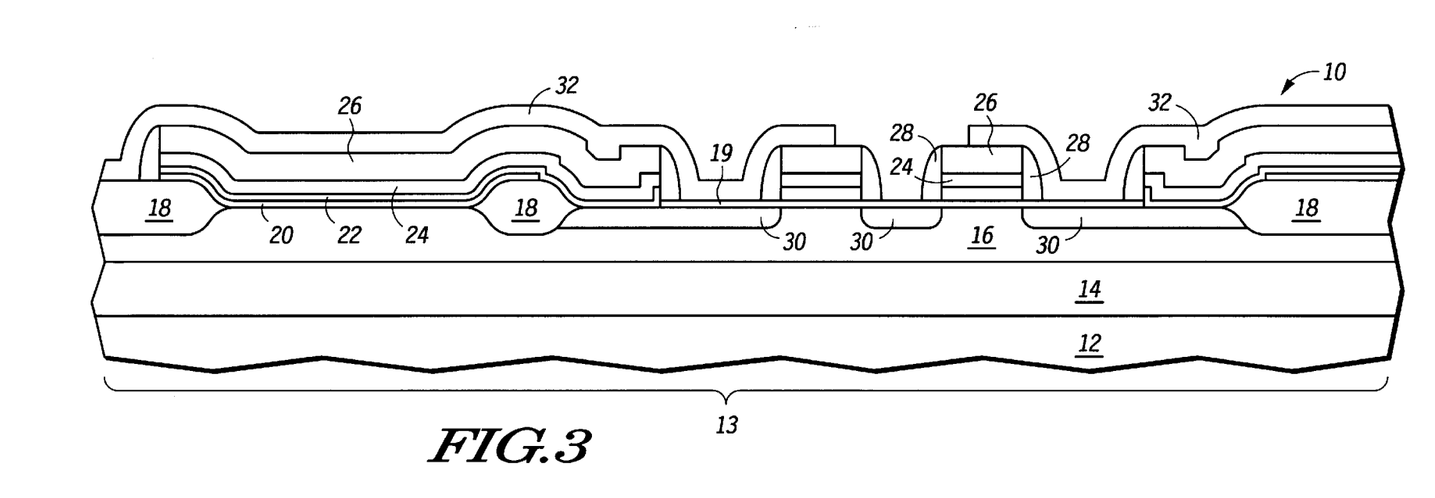

FIG. 3 illustrates that a furnace tetraethylorthosilicate (FTEOS) layer 32 is deposited overlying the gate polysilicon structures 21. A typical thickness of this layer ranges from between 1,000 Angstroms and 3,000 Angstroms. Lithographic processing and etching is used to form an opening through the dielectric layer 32 as illustrated in FIG. 3. This opening exposes an output node portion of the SRAM cell wherein the output node of the SRAM cell is a current electrode (drain or source) that coupled the bit-line N-channel MOS transistor to the pull down N-channel MOS transistor coupled to ground (GND).

Figure 4:
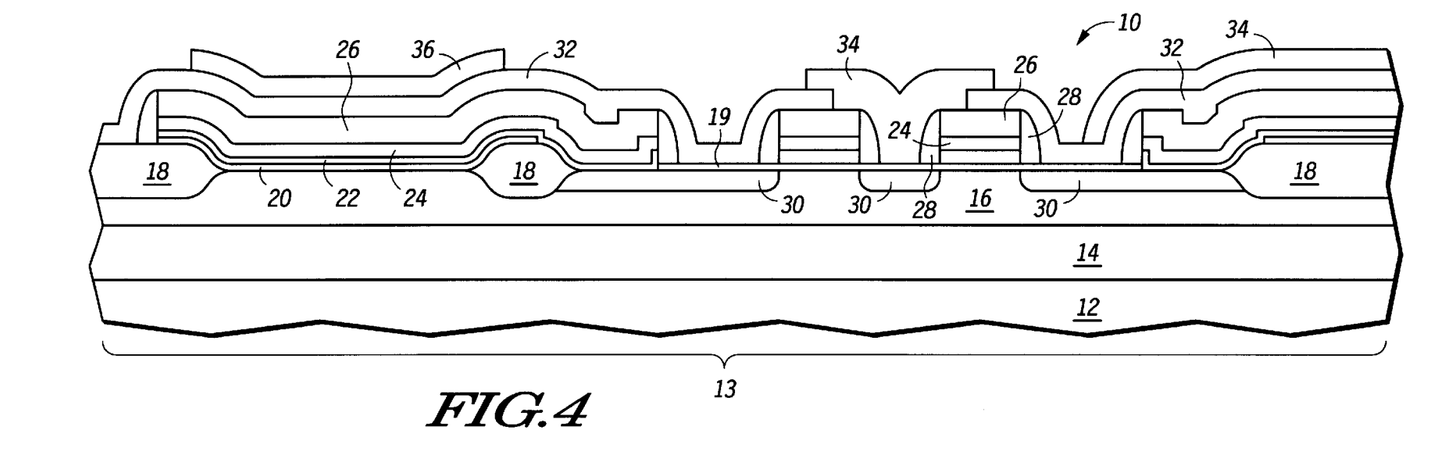

In FIG. 4, a polysilicon layer (referred to as window poly) is deposited and optionally salicided or silicided using a titanium metal layer or a like refractory metal. This polysilicon layer is then lithographically patterned and etched in order to result in poly regions 34 and poly regions 36 in FIG. 4 which are made of polysilicon. A middle region 34 of FIG. 4 is used to contact the output node of the SRAM cell. The region 36 of FIG. 4 is a section of polysilicon which is used to form a fuse connection in series with the bit line electrical path of each SRAM cell in the array. Although not illustrated specifically, each SRAM cell with have at least two fuses, one for the bit line signals and the other for the complementary bit line signal. A top down illustration of the polysilicon fuse structure 36 is illustrated in subsequent FIG. 8.

Figure 5:
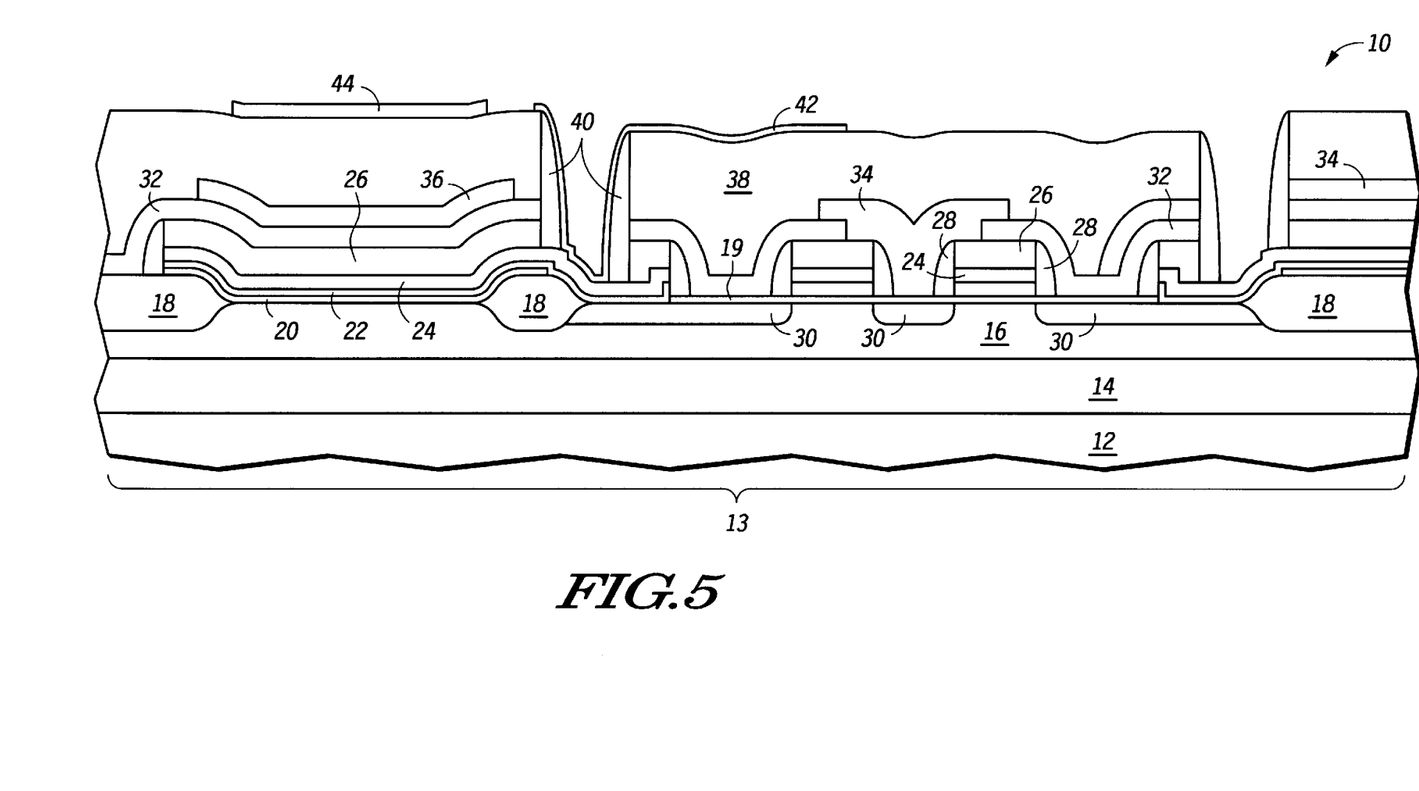

In FIG. 5, a dielectric layer 38 is formed. In a preferred form, layer 38 is made from a teraethylorthosilicate (TEOS) process. Specifically, layer 38 is initially deposited as a plasma TEOS (PTEOS) layer having a thickness of 12,000 Angstroms. This layer is then etched back using an etch back process, resulting in a final plasma TEOS thickness of roughly 2,000 Angstroms. Then, 2,000 Angstroms of furnace TEOS (FTEOS) is deposited on the 2,000 Angstroms of PTEOS to result in the final dielectric layer 38 illustrated in FIG. 5 which is roughly 4,000 Angstroms in total thickness. In FIG. 5, an opening is etched through layer 38 to expose a portion of the A poly and B poly structure 20 and 22 in FIG. 5. FIG. 5 illustrates two such contact openings to A/B poly 20 and 22. In a preferred form, oxide is etched using an $CF_4$ and $CHF_3$ chemistry. Typically, this chemistry also includes an inert carrier source such as argon (Ar). Nitride layers may also be etched using an argon, $CF_4$ and $CHF_3$ chemistry. In addition, polysilicon etches as taught herein can be performed using a chlorine ($Cl_2$) and hydrogen bromide (HBr) etch chemistry. After formations of the openings illustrated in FIG. 5, a nitride spacer 40 is used to insulate any exposed sidewalls of polysilicon within the openings from subsequent conductive interconnect members.

After both the formation of the openings in FIG. 5 and the deposition/etch of a nitride layer to form the nitride spacers 40, a thin (1000 Angstroms or less) polysilicon layer is deposited. The polysilicon layer 42 may be used to form a thin resistor element, or may be deposited thicker than 1000 Angstroms and used to form a thin film transistor (TFT) structure. This thin film transistor structure or poly resistor is coupled to the underlying polysilicon layers and substrate-formed transistor electrodes through the openings as illustrated in FIG. 5. The same poly layer which is used to form the resistive element 42 is also used to form a poly etch stop layer 44 overlying the fuse 36 as illustrated in FIG. 5. It is important to note that one dimension of the etch stop layer 44 (dimension W in FIG. 8) is greater than a width dimension Z of the fuse region 36 so that the deep laser repair opening can be formed properly with lithographic alignment tolerances being properly considered.

In a preferred form, in order to save deposition steps and etch steps, the etch stop region 44 is formed in FIG. 5 from the same poly layer and same lithographic/etch steps as is the resistive element 42 in FIG. 5. However, one could easily deposit layer 42 and layer 44 in separate steps and pattern/etch these two layers in separate steps so that material 44 may be different from the material of layer 42. For example, layer 44 may be a subsequently deposited layer of additional polysilicon, a nitride layer, a silicide region, or salicide region, a metal layer, another type of oxide such as germanium oxide, or any other material which can be etched selective to TEOS.

After formation of the etch stop layer 44, a dielectric layer 46 is deposited. Layer 46 is a thin 500 Angstrom to 2,000 Angstrom layer of TEOS followed by a borophosphosilicate glass (BPSG) layer that is typically several thousand Angstroms thick. The thin 500 Angstrom to 2,000 Angstrom layer of TEOS is used to protect the underlying polysilicon from being adversely doped by dopant atoms in the BPSG portion of layer 46. The BPSG layer is initially deposited greater than two microns and polished using a chemical mechanical polish (CMP) process to form a highly planarized inter-level dielectric (ILD) layer made from BPSG. Spin on glass (SOG) technology may be used to replace the BPSG film. It is important to note, that the dielectric layers taught herein can be any non-conductive dielectric layer as is known in the art. In addition, BPSG may be optionally reflowed or annealed before a CMP process is performed. After formation of the BPSG layer 46, an etch step is used to etch openings through layer 46 and TEOS layer 38 to form electrical contacts 48 to the window poly layer. In addition to forming openings through layers 46 and 48 to contact window poly 36 and 34, simultaneous openings are also formed to contact directly to active layers/electrodes within the substrate and A poly/B poly layers 20 and 22 which were previously formed.

Typically, the contact plug 48 is a tungsten conductive region which is formed using CMP. In a preferred form, tungsten plugs are initially lined with a titanium and/or titanium nitride (TiN) barrier layer to separate the tungsten plug material from the underlying polysilicon regions. In addition, additional capping layers may be deposited on top of the tungsten plug as are needed to insulate the tungsten from overlying conductive members.

Figure 6:
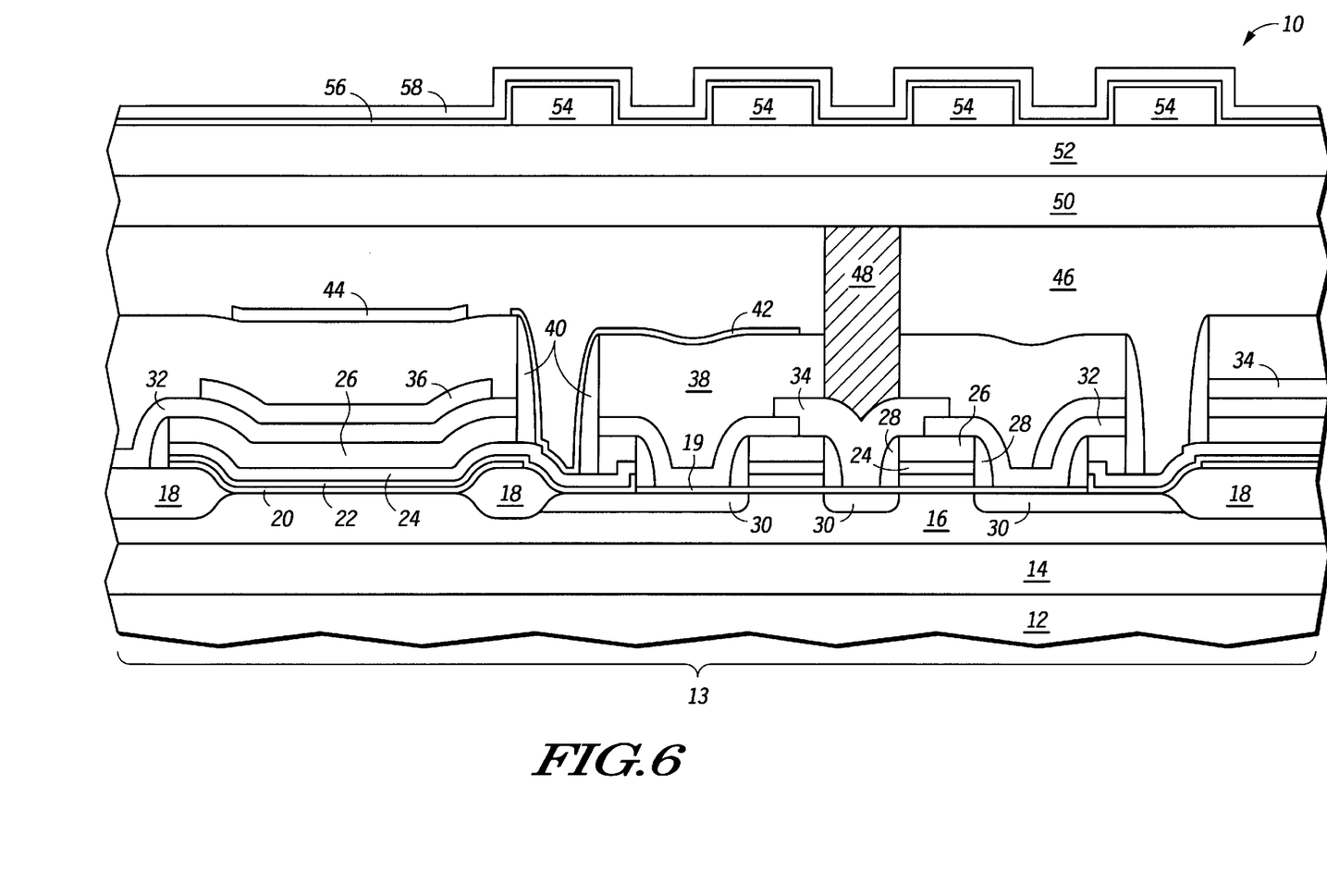

After formation of the tungsten plug 48 in FIG. 6, a first metal layer 50 is formed. Typically, metal layer 50 is of a thickness of roughly 5,000 to 8,000 Angstroms. In addition, the deposition of metal 50 is formed primarily of an aluminum copper alloy. Optionally, the aluminum copper alloy, which comprises a large central portion of the metal layer 50, can have underlying it a titanium or titanium nitride (TiN) barrier and may be additionally capped with an optional titanium and/or titanium nitride top layer. In general, an anti-reflective coating (such as TiN) is preferably formed on top of the metal layer 50 to improve lithographic processing. It is important to note, although it is not illustrated in FIG. 6, that the metal layer 50 is lithographically patterned and etched using a chlorine-based chemistry. After formation of the metal layer 50, an inter-level (ILD) dielectric 52 is deposited in FIG. 6. In one form, the dielectric layer 52 is made of TEOS. In yet another form, the dielectric layer 52 is a stacked TEOS layer comprising a plasma TEOS bottom portion, an ozone TEOS middle portion, followed by a top portion of an additional plasma TEOS layer.

Figure 7:
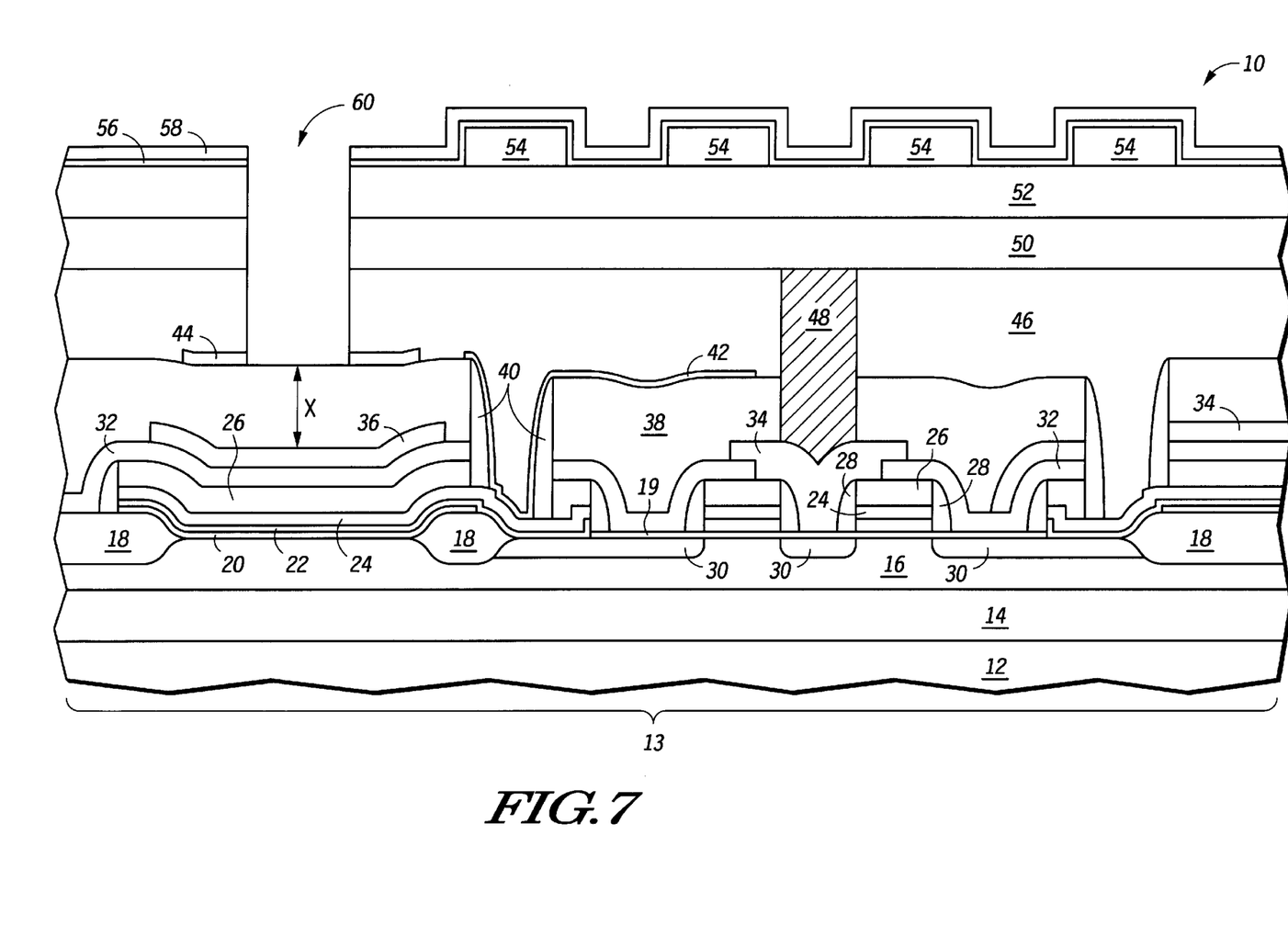

After formation of the inter-level dielectric layer 52, second-level metal regions 54 are formed as illustrated in FIG. 6 after formation of inter-metal vias (not illustrated in FIG. 6 or FIG. 7). The formation of the metal regions 54 is similar to the formation of the metal regions 50 in many respects. A PSG passivation layer 56 is then deposited over the second layer of metal 54. In addition, a plasma enhanced nitride (PEN) layer 58 is deposited as a final passivation layer overlying the integrated circuit 10.

FIG. 7 illustrates that etch processing is performed to expose bond pads (not illustrated in FIG. 7) formed from metal 54 and to simultaneously etch roughly 25,000 to 35,000 Angstroms through oxide layers 58, 56, 52, 50,46, etc., to form a deep laser-repair opening 60. Therefore, when etching to form the bond pad areas of metal 54, laser repair openings 60 are simultaneously begun and continue to be formed to allow for laser access to underlying fuses 36. The opening 60 is etched by using a $CHF_3$, $CF_4$, argon chemistry. This chemistry, while etching oxide at a high rate, is highly selective to polysilicon (such as polysilicon etch stop layer 44). Therefore, the etch stop region 44 illustrated in FIG. 7 is used to terminate the etch of the opening 60 by reducing the etch rate of the opening significant upon exposure of the etch stop layer 44. After using the layer 44 as an etch stop layer, the exposed portion of the etch stop layer can be optionally removed as illustrated in FIG. 7. The result is that the thickness X of the dielectric layer 38 is ensured to always be the thickness or capping layer overlying the fuse. Therefore, the cap oxide layer above the fuses in each wafer, in each integrated circuit, and in each cell is guaranteed to be substantially uniform to the thickness X of FIG. 7. This thickness X is typically within a range of 2,000 and 4,000 Angstroms to ensure for high yield laser repair of the SRAM cell. Deposition of TEOS layers such as layer 38 can be performed in the industry with small wafer-to-wafer and cross-wafer variation of less than 1%. Therefore, the value of X will vary from site to site by less than 1% which is a significant improvement over the prior art timed etch method. Furthermore, by using a portion of the resistor poly as the etch stop layer 44, no additional deposition steps and no additional lithography and etch steps are needed to improve the device yield. Therefore, this advantage is achieved without a cost hit, without complicating process integration, and without a throughput penalty. In summary, by using the etch stop layer 44, consistent thickness X for each SRAM cell in each integrated circuit and each integrated circuit in the wafer is insured. Furthermore, wafer-to-wafer variation is eliminated.

Figure 8:
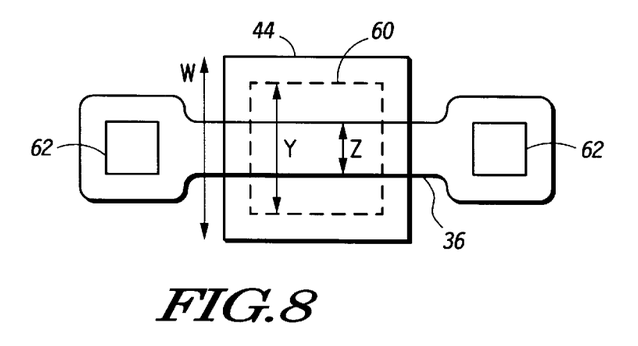
FIG. 8 illustrates a top perspective view of the etch stop layer and opening used to provide a laser repairable area in the SRAM cell of FIG. 7 in accordance with the present invention.

FIG. 8 illustrates a top perspective view of the fuse structure illustrated in FIG. 7 in a cross-sectional manner in FIG. 7. FIG. 8 illustrates, in top perspective view, the poly fuse 36. The fuse 36 has a top-down width dimension Z which is not capable of illustration in FIG. 7. The dimension Z is formed less than a circumference or radius Y of the opening 60 as illustrated in FIG. 8. If the dimension Y of the opening 60 is not larger than the dimension Z of the polysilicon fuse 36, then complete vaporization of the width Z of the polysilicon fuse 36 may not be possible using a laser which may be disadvantageous. FIG. 8 also illustrates that a dimension W of the etch stop portion 44 is formed larger than the perimeter of the opening 60 to ensure proper manufacturing tolerances to compensate for misalignment in lithography.

Figure 9:
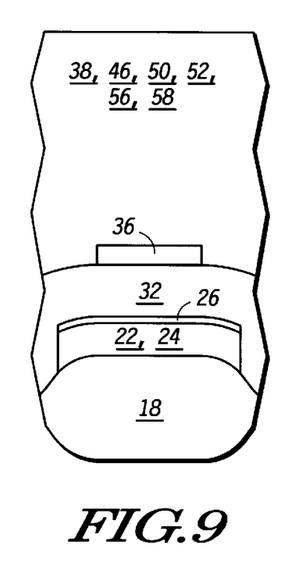
FIGS. 9–11 illustrate an alternate fuse structure that can be used in place of the fuse structure illustrated in FIGS. 1–7.
Figure 10:
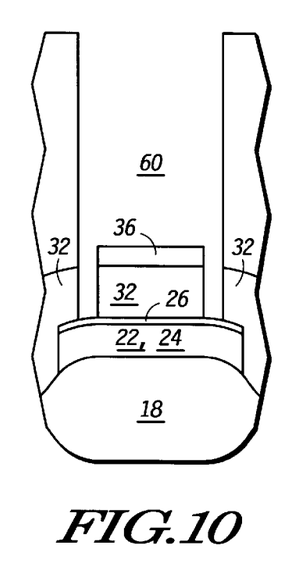
Figure 11:
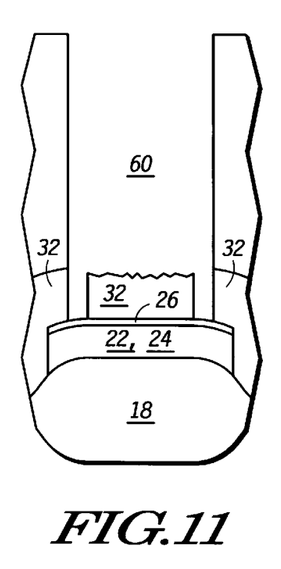

FIGS. 9–11 illustrate an alternate fuse structure which can be used in place of the fuse structure illustrated in the left hand side of FIGS. 1–7. FIG. 9 illustrates that the fuse layer 36 can be formed overlying the field oxide layer 18. In addition, FIG. 9 illustrates that an etch stop layer, which can be a nitride layer or any layer which can etch selective to silicon, polysilicon, amorphous silicon, or the like, can be formed underlying the fuse 36 (as opposed to overlying the fuse as in FIG. 7). In a preferred form, the layer which underlies layer 36 can be a lithographically patterned and etched portion of the gate poly layers 22 and 24 which comprise a capping layer 26. The capping layer 26, as taught herein, can be one or more of a silicided layer such as titanium or tungsten silicide and/or a nitride or anti-reflective coating (ARC) dielectric layer. Either the silicide top portion of the gate poly or a nitride cap layer/ARC layer overlying the gate poly 22 and 24 can be used as an etch stop which underlies the fuse 36.

In another form, polysilicon, amorphous silicon or the like can be used as the entire etch stop underlying the fuse. However, care must be taken if the exposed etch stop has an exposed conductive region. When a laser, electrical charge, or a like energy source is used to vaporize the fuse, residual conductive residue from the vaporized fuse may coat the sidewalls of the opening 60 if the laser energy is not optimal. In some designs, the conductive residue can electrically short circuit the underlying etch stop layer (if the etch stop layer comprises exposed conductive material) to unvaporized sidewall portions of the 36 as illustrated in FIG. 8 in conjunction with FIG. 9. Therefore, it is preferred that at least a top portion of the underlying etch stop layer be nitride or a like dielectric to improve yield and ease tolerances on the laser fuse operation.

In general, the overlying fuse 44 first taught as being formed by resistor polysilicon in FIG. 7, may be replaced with an underlying etch stop layer 26 as illustrated in FIG. 9. In a manner similar to FIG. 7, FIG. 9 also illustrates the placement of the dielectric layers 32, 38, 46, 50, 52, 56, and 58 as were previously discussed. The opening 60 illustrated in FIG. 7 is etched selective to an overlying etch stop 44, whereas the opening in FIG. 10 is etched until the fuse 36 is exposed within the opening 60. The underlying etch stop layer made of layer 26 is used as a safety etch stop so that any over etching used to expose the fuse 36 will not trench or expose the field oxide 18 or underlying substrate conductive regions. It is not unusual for the timed etch to terminate before a portion of the etch stop 22, 24, and 26 are exposed. It is important to note that the underlying etch stop is just a safety measure that need to be used for all openings 60, all wafers, or all die, but will limit a maximal possible vertical depth of the opening 60. It is not unusual for the combined thicknesses of the layers 38, 46, 50, 52, 56, and 58 to vary in thickness by several thousand Angstroms (possibly 2,000 Angstroms to 7,000 Angstroms) due to deposition standard deviations, CMP processing inconsistencies, etch-back inconsistencies, dielectric reflow inconsistencies, etc.. This deviation in thickness should be accommodated by an over-etch process or optical endpoint detection mechanism when etching the opening 60. Thus, the need for the protective underlying etch stop layer 22, 24, and 26.

FIG. 11 illustrates that a laser or like energy source is focused onto the conductive region 36 previously described in FIG. 10 and is used to remove the conductive region 36 to result in an electrical open circuit within the SRAM cell in accordance with the teachings above. In general, the process of FIGS. 9–11 offers an addition advantage in that the polysilicon layer 36 is directly exposed to the opening 60. In FIG. 11, there is no overlying oxide thickness X above the fuse as illustrated in FIG. 7. Due to the lack of thickness X in FIG. 11, a lower energy laser source can be used to vaporize the region 36 of FIG. 9 as compared to a higher energy level needed for the electrical disconnection of the structure of FIG. 7. Therefore, a cheaper and longer lasting laser source can be utilized to perform the vaporizing operation illustrated in FIG. 11 to reduce manufacture cost and improve the lifetime and up-time of the laser equipment.

While the present invention has been illustrated and described with referenced specific embodiments and materials, further modifications and improvements will occur to those skilled in the art. For example, the thickness X may comprise several types of dielectric material resulting from layer 38 being formed as a composite dielectric. Plurality, as used herein, is intended to mean any integer value greater than the value of one and should not be limited to any specific integer or subrange. It is important to note that a three level polysilicon process is primarily discussed herein but that this etch-stop fuse technique can be used for any number of polysilicon layers greater than or equal to two. All of conductive layers, conductive plug regions, and dielectrics may be subject to CMP at different stages of manufacturing herein. It is possible to improve the etch time and throughput of the process taught herein by using optical endpoint and monocrometer etch equipment to detect when the opening 60 has cleared oxide and stopped on the etch stop layer (FIG. 7) or the fuse layer and/or etch stop layer (FIG. 11). It is to be understood, therefore, that this invention is not limited to the particular forms illustrated and that is appended in the claims to cover all modifications that do not depart from the spirit and scope of this invention.

What is claimed is:

1. A method of forming a semiconductor device, the method comprising:

forming a conductive region overlying a substrate;

forming an etch stop layer overlying the conductive region;

forming at least one dielectric layer overlying the etch stop layer;

etching an opening through the at least one dielectric layer using the etch stop layer as an etch stop for forming the opening, wherein the opening has a bottom, and at least a portion of the etch stop layer lies along the bottom of the opening at the end of the step of etching; and using focused energy through the opening to affect the conductivity of the conductive region, wherein the at least a portion of the etch stop layer lies along the bottom of the opening during this step.

2. The method of claim 1 wherein the step of using focused energy comprises:

using a laser source to provide a laser as the focused energy through the opening to affect the conductivity of the conductive region.

3. The method of claim 1, wherein the step of using focus energy comprises:

vaporizing, via the focused energy, a portion of the conductive region to form an electrical open-circuit where the conductive region was previously located.

4. The method of claim 1 wherein the step of forming an etch stop layer overlying the conductive region further comprises:

forming the etch stop layer from a polysilicon layer.

5. The method of claim 4 wherein the step of forming the etch stop layer further comprises:

forming a resistive element overlying the substrate wherein the resistive element is lithographically formed from the same polysilicon layer that is used to form the etch stop layer.

6. The method of claim 5 wherein the step of forming the etch stop layer further comprises:

forming the resistive element as an element selected from the group consisting of: a polysilicon resistor and a thin film transistor(TFT).

7. The method of claim 1, wherein the etch stop layer includes a nitrogen-containing material.

8. The method of claim 1 wherein the step of forming a conductive region comprises:

forming the conductive region as a layer of polysilicon.

9. The method of claim 8 wherein the step of forming a conductive region comprises:

forming the conductive region as a fuse made of polysilicon and coupled in series with a bit line transistor of a random access memory (RAM) cell.

10. The method of claim 8 wherein the step of forming a conductive region comprises:

forming the fuse from the same layer of polysilicon which is used to make electrical contact to a storage node of a random access memory (RAM) cell.

11. The method of claim 1 further comprising:

using the focused energy to decouple an inoperable memory cell from the semiconductor device in order to allow for the substitution of a redundant functional memory cell in the place of the inoperable memory cell.

12. A method for forming a semiconductor device, the method comprising:

forming an etch stop layer over a substrate;

forming a first dielectric layer over the substrate;

forming a fuse region over the first dielectric layer;

forming a second dielectric layer over the fuse region;

etching an opening to expose a portion of the etch stop layer, wherein the opening has a bottom, and the portion lies along the bottom of the opening at the end of the step of etching;

using focused energy through the opening to affect the conductivity of the fuse region, wherein the portion of the etch stop layer lies along the bottom of the opening during this step.

13. The method of claim 12 wherein the step of etching comprises:

etching the opening so that a portion of the etch stop layer underlying the fuse layer is exposed by a portion of the opening.

14. The method of claim 12 wherein the step of etching comprises:

optically end-pointing an etch process used to form the opening when one of either the fuse region is exposed by the opening or when the etch stop layer is exposed by the opening.

15. The method of claim 12 wherein the step of forming a fuse region further comprises:

forming the fuse region from a silicon semiconductive layer wherein the same silicon semiconductive layer is used to form a contact, which is electrically separated from the fuse region, to a transistor current electrode within the substrate.

16. The method of claim 12 wherein the step of forming an etch stop layer further comprises:

forming the etch stop layer as a silicon semiconductive layer which is capped with a nitride layer.

17. The method of claim 12 wherein the step of forming an etch stop layer further comprises:

forming the etch stop layer as a silicon semiconductive layer which is capped with a refractory metal silicide.

18. The method of claim 12 wherein the step of forming an etch stop layer further comprises:

forming the etch stop layer as a silicon semiconductive layer which is capped with both a refractory metal silicide and nitride layer.

19. The method of claim 12 wherein the step of forming an etch stop layer further comprises:

forming the etch stop layer as a silicon nitride layer.

20. The method of claim 12 wherein the step of etching further comprises:

using the etch chemistry wherein the etch chemistry etches the at least one dielectric layer at a first etch rate and etches the etch stop layer at a second etch rate, the first etch rate being greater than the second etch rate.

21. A method of forming a semiconductor device, the method comprising:

forming a conductive region overlying a substrate;

forming an etch stop layer overlying the conductive region, wherein the etch stop layer comprises a nitrogen-containing material;

forming at least one dielectric layer overlying the etch stop layer;

etching an opening through the at least one dielectric layer using the etch stop layer as an etch stop for forming the opening; and using focused energy through the opening to affect the conductivity of the conductive region.

* * * * *